United States Patent
Park et al.

(10) Patent No.: US 10,566,201 B1
(45) Date of Patent: Feb. 18, 2020

(54) GATE CUT METHOD AFTER SOURCE/DRAIN METALLIZATION

(71) Applicant: GLOBALFOUNDRIES Inc., Grand Cayman (KY)

(72) Inventors: Chanro Park, Clifton Park, NY (US); Ruilong Xie, Niskayuna, NY (US); Hui Zang, Guilderland, NY (US); Laertis Economikos, Wappingers Falls, NY (US); Andre LaBonte, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/174,510

(22) Filed: Oct. 30, 2018

(51) Int. Cl.
| | | |
|---|---|---|
| *H01L 21/28* | (2006.01) | |
| *H01L 21/8234* | (2006.01) | |
| *H01L 21/3213* | (2006.01) | |
| *H01L 27/088* | (2006.01) | |
| *H01L 29/423* | (2006.01) | |
| *H01L 23/535* | (2006.01) | |
| *H01L 29/66* | (2006.01) | |

(52) U.S. Cl.
CPC .. *H01L 21/28123* (2013.01); *H01L 21/32136* (2013.01); *H01L 21/32139* (2013.01); *H01L 21/823431* (2013.01); *H01L 21/823437* (2013.01); *H01L 21/823475* (2013.01); *H01L 23/535* (2013.01); *H01L 27/0886* (2013.01); *H01L 29/42376* (2013.01); *H01L 29/66545* (2013.01)

(58) Field of Classification Search
CPC ......... H01L 21/28123; H01L 21/32136; H01L 21/32139; H01L 21/823437; H01L 21/823475; H01L 23/535; H01L 27/0886; H01L 29/42376
See application file for complete search history.

(56) References Cited

U.S. PATENT DOCUMENTS

| | | | |
|---|---|---|---|
| 9,064,932 B1 | 6/2015 | Pham et al. | |
| 9,190,260 B1* | 11/2015 | Zhang | H01L 43/02 |
| 9,508,727 B2 | 11/2016 | Park et al. | |
| 2015/0021683 A1* | 1/2015 | Xie | H01L 29/6653 |
| | | | 257/330 |
| 2015/0318178 A1* | 11/2015 | Pham | H01L 21/28 |
| | | | 257/288 |
| 2016/0163585 A1* | 6/2016 | Xie | H01L 21/76843 |
| | | | 257/368 |

* cited by examiner

*Primary Examiner* — Nathan W Ha
(74) *Attorney, Agent, or Firm* — Amerson Law Firm, PLLC

(57) ABSTRACT

A method that includes forming a conductive source/drain structure that is conductively coupled to source/drain regions of first and second transistor devices, selectively forming a conductive source/drain metallization cap structure on and in contact with an upper surface of the conductive source/drain structure, forming a patterned etch mask that exposes a portion of the gate cap and a portion of the conductive source/drain metallization cap structure, and performing at least one etching process to remove the exposed portion of the gate cap and thereafter an exposed portion of the final gate structure so as to form a gate cut opening, wherein the conductive source/drain metallization cap structure protects the underlying conductive source/drain structure during the at least one etching process.

17 Claims, 21 Drawing Sheets

GATE CUT METHOD AFTER SOURCE/DRAIN METALLIZATION

BACKGROUND

1. Field of the Disclosure

The present disclosure generally relates to the fabrication of integrated circuits, and, more particularly, to various methods of cutting gate structures after the formation of source/drain metallization structures and various novel integrated circuit (IC) product structures.

2. Description of the Related Art

In modern integrated circuits, such as microprocessors, storage devices and the like, a very large number of circuit elements, especially transistors, are provided on a restricted chip area. Field Effect Transistors ("FETs") come in a variety of shapes and forms, e.g., planar transistors, FinFET transistors, vertical transistors, nanowire devices, etc.

In advanced integrated circuit (IC) products, the gate structures for the transistor devices are typically manufactured using well-known replacement gate (or "gate-last") manufacturing techniques. In general, the replacement gate manufacturing technique involves the formation of a sacrificial (or "dummy") gate structure comprised of a sacrificial gate insulation layer (e.g., silicon dioxide) and a layer of a sacrificial gate electrode material (e.g., polysilicon or amorphous silicon). The sacrificial gate structures are initially formed as continuous line-type structures that extend across the entire substrate, including across both active regions and isolation regions located between active regions.

The long continuous line-type sacrificial gate structures are formed by depositing the materials for the sacrificial gate structures across the entire substrate, forming a patterned gate etch mask above the deposited sacrificial gate materials and performing one or more etching processes through the patterned gate etch mask to remove the exposed portions of the sacrificial gate materials. Various process operations are performed with the sacrificial gate structure in position, e.g., source/drain implantation processes, the formation of epi semiconductor material in the source/drain regions of the transistor devices, etc.

At some point after other processing has occurred, e.g., after formation of epi material in the source/drain regions of the devices, a patterned etch mask—a "gate-cut" mask—is formed above the product. The gate cut mask includes openings at locations where it is desired to remove or "cut" portions of the long continuous line-type sacrificial gate structures so as to form or define individual portions or segments of the original long continuous line-type sacrificial gate structures. One or more etching processes are performed to remove exposed portions of the gate cap and the sacrificial gate structure and thereby form a gate cut opening between the now-separate individual portions or segments of the original long continuous line-type sacrificial gate structures. An insulating material will be formed in the gate cut opening. Eventually, these individual portions or segments of the original long continuous line-type sacrificial gate structures will be removed and replaced with final replacement gate structures.

As device dimensions continue to decrease and as packing densities of transistor devices on a substrate continue to increase, various problems have arisen as it relates to performing the gate-cut process operation involved when using traditional replacement gate manufacturing techniques. For example, as device scaling continues, the critical dimension (CD) of the gate cut opening (in the gate width direction of the transistors) continues to shrink. Additionally, due to the closer spacing between adjacent transistor devices, it is very important that the gate cut opening be located as precisely as possible in the exact middle of the space between adjacent transistor devices. Any offset in the placement of the gate cut opening and/or forming the gate cut opening with a larger than desired CD can be problematic as it relates to the formation of additional materials and structures on the IC product as manufacturing operations proceed. Such problems may make the formation of quality replacement gate structures more difficult and may result in decreased device performance or complete device failure.

The present disclosure is directed to various methods of cutting gate structures after the formation of source/drain metallization structures and various novel integrated circuit (IC) product structures that may solve or at least reduce one or more of the problems described above.

SUMMARY

The following presents a simplified summary of the disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

Generally, the present disclosure is directed to various methods of cutting gate structures after the formation of source/drain metallization structures and various novel integrated circuit (IC) product structures. One illustrative method disclosed herein includes forming a gate above a semiconductor substrate for first and second transistor devices, the gate including a final gate structure and a gate cap positioned above the final gate structure, forming source/drain regions for the first and second transistor devices, and forming a conductive source/drain structure that is conductively coupled to a source/drain region of the first transistor device and conductively coupled to a source/drain region of the second transistor device. In this example, the method also includes performing a selective area deposition process to selectively form a conductive source/drain metallization cap structure on and in contact with an upper surface of the conductive source/drain structure, forming a patterned etch mask that exposes a portion of an axial length of the gate and a portion of an axial length of the conductive source/drain metallization cap structure and performing at least one etching process to remove the exposed portion of the gate cap and thereafter an exposed portion of the final gate structure so as to form a gate cut opening, wherein the conductive source/drain metallization cap structure protects the underlying conductive source/drain structure during the at least one etching process. Another illustrative method disclosed herein further includes forming a gate separation structure in the gate cut opening, wherein the gate separation structure comprises an insulating material.

One illustrative integrated circuit product disclosed herein includes a first final gate structure for a first transistor device, a second final gate structure for a second transistor device and a gate separation structure positioned between the first and second final gate structures, wherein the gate separation structure comprises an insulating material. In one illustrative embodiment, the gate separation structure has a substantially uniform width (in a direction corresponding to the gate width direction of the transistor devices) for substantially an entire vertical height of the gate separation structure and a first side surface and a second side surface, wherein an end surface of the first final gate structure contacts the first side surface of the gate separation structure and an end surface of the second final gate structure contacts the second side surface of the gate separation structure.

BRIEF DESCRIPTION OF THE DRAWINGS

The disclosure may be understood by reference to the following description taken in conjunction with the accompanying drawings, in which like reference numerals identify like elements, and in which.

Figure 1:
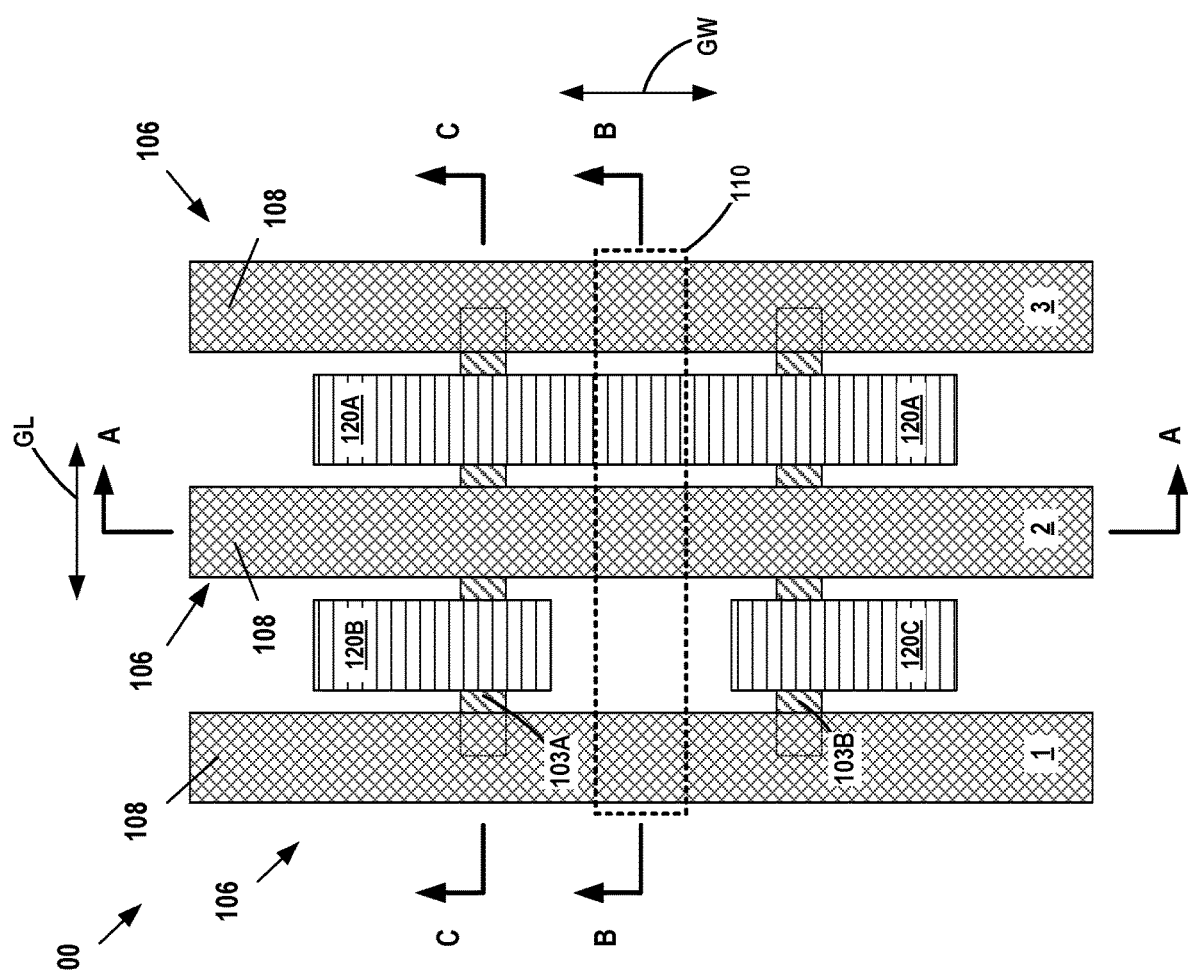
FIGS. 1-21 depict various methods of cutting gate structures after the formation of source/drain metallization structures and various novel integrated circuit (IC) product structures.
Figure 2:
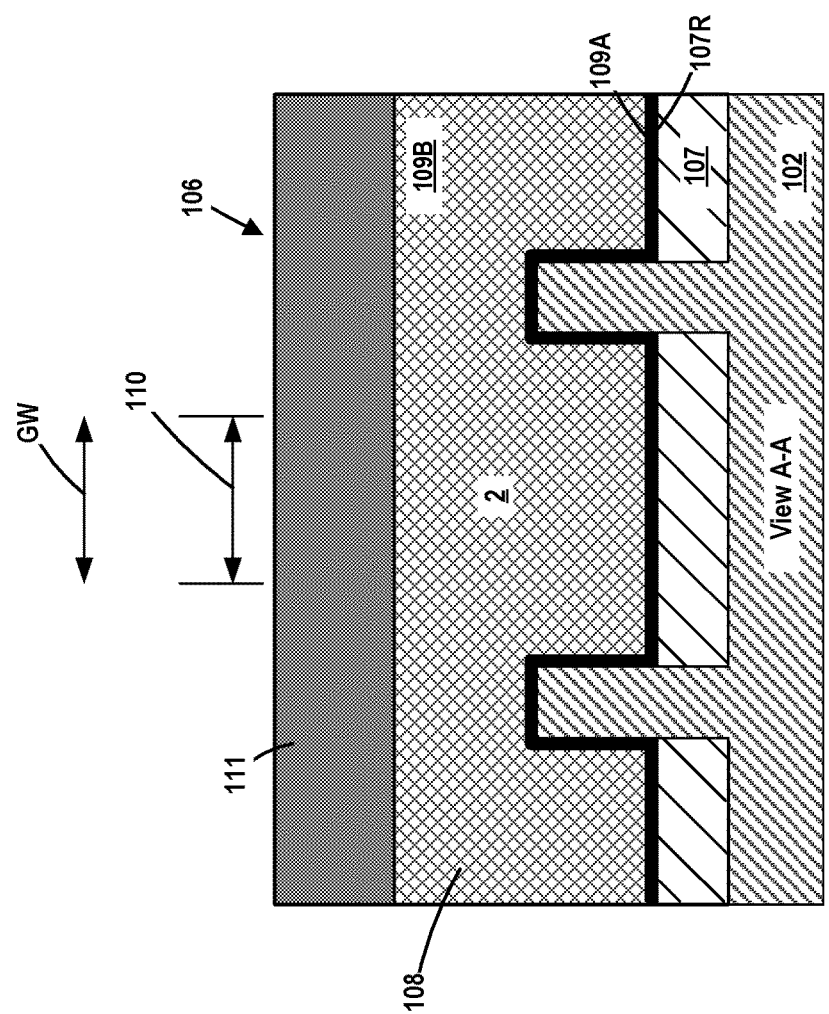
Figure 3:
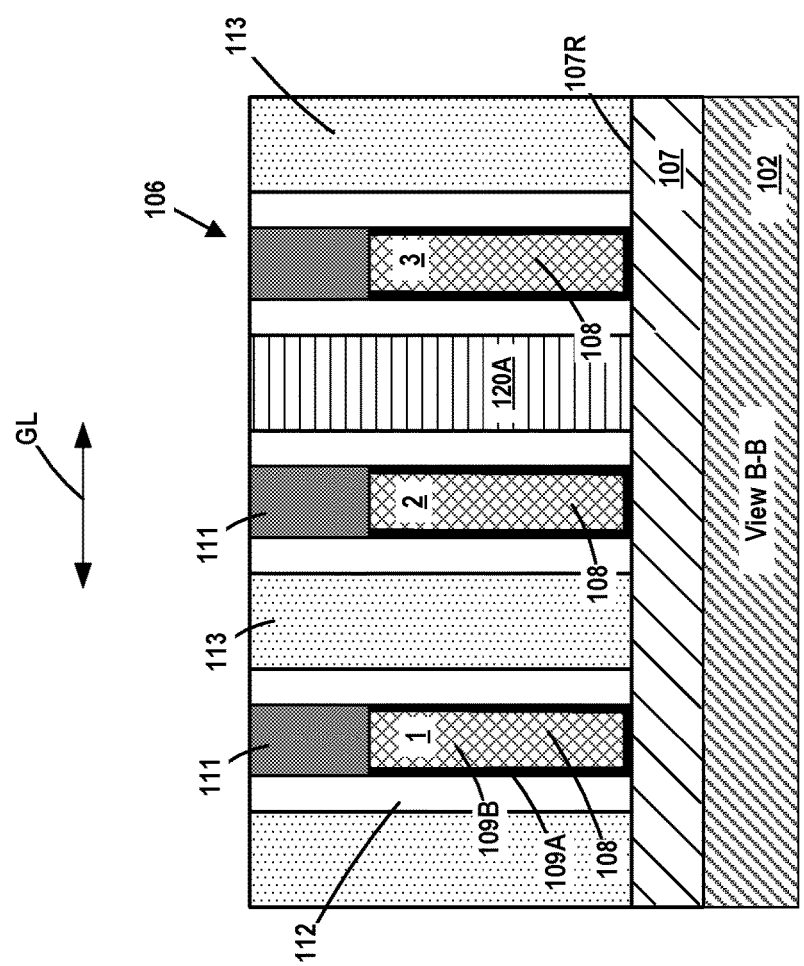
Figure 4:
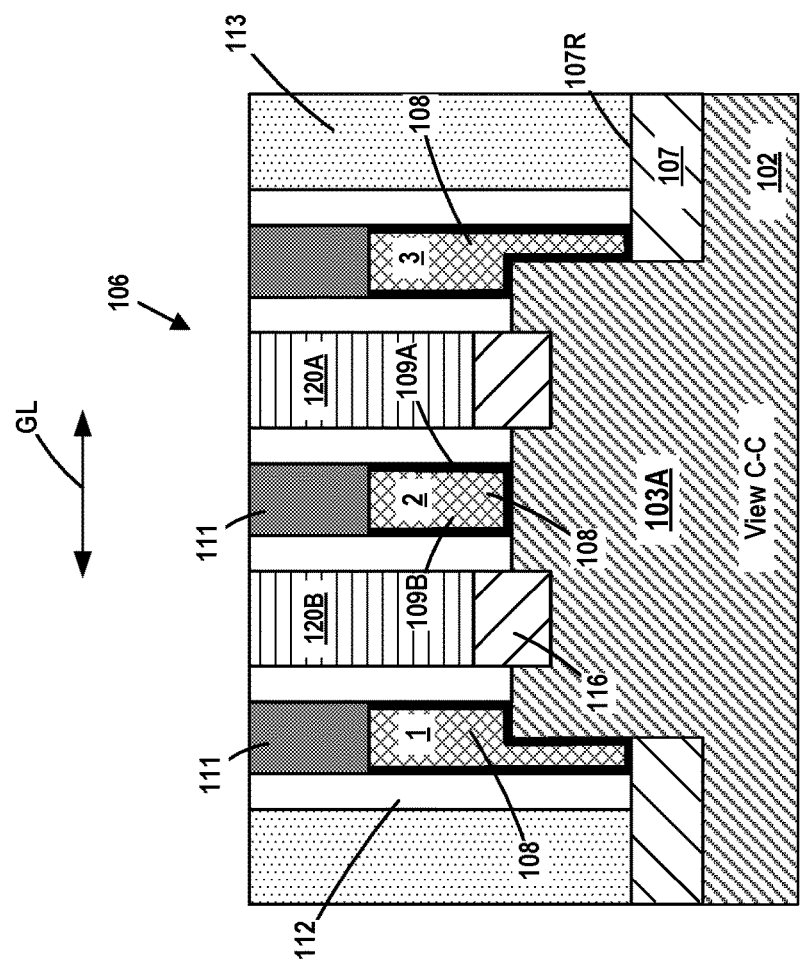
Figure 5:
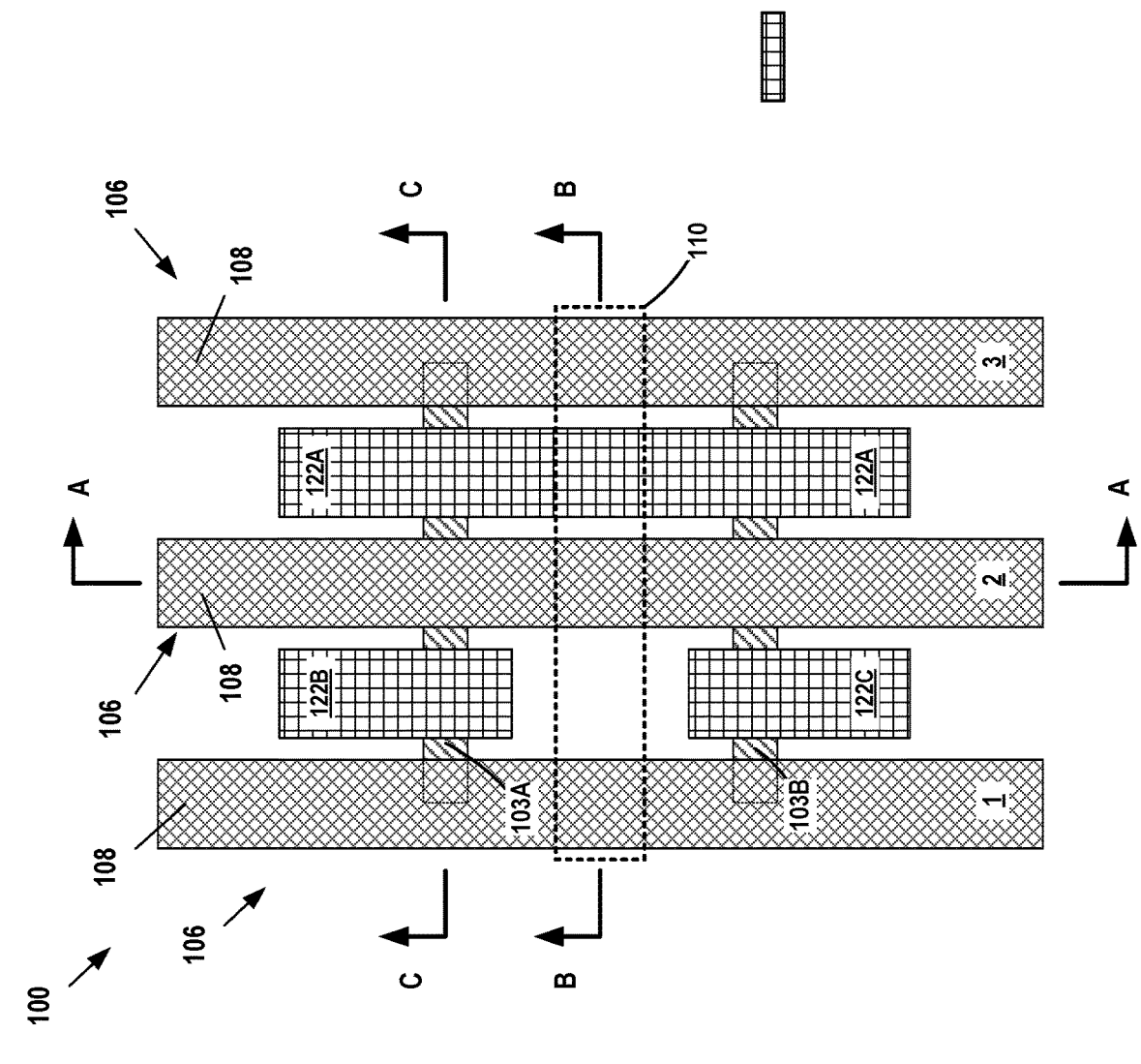
Figure 6:
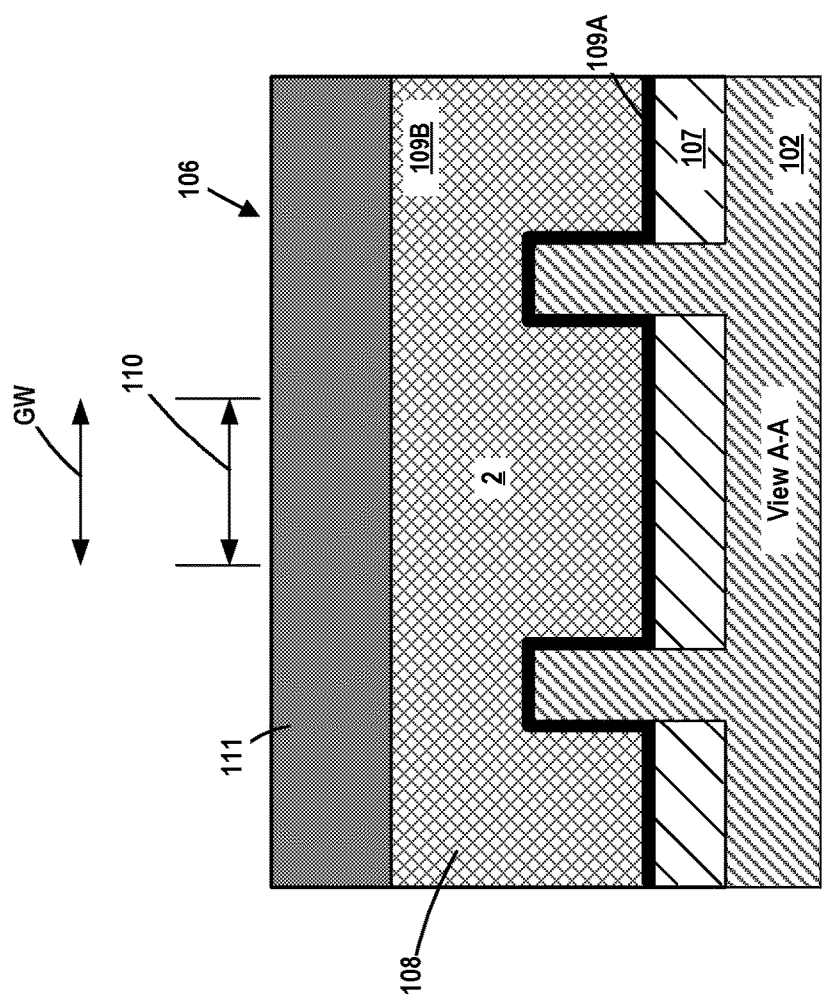
Figure 7:
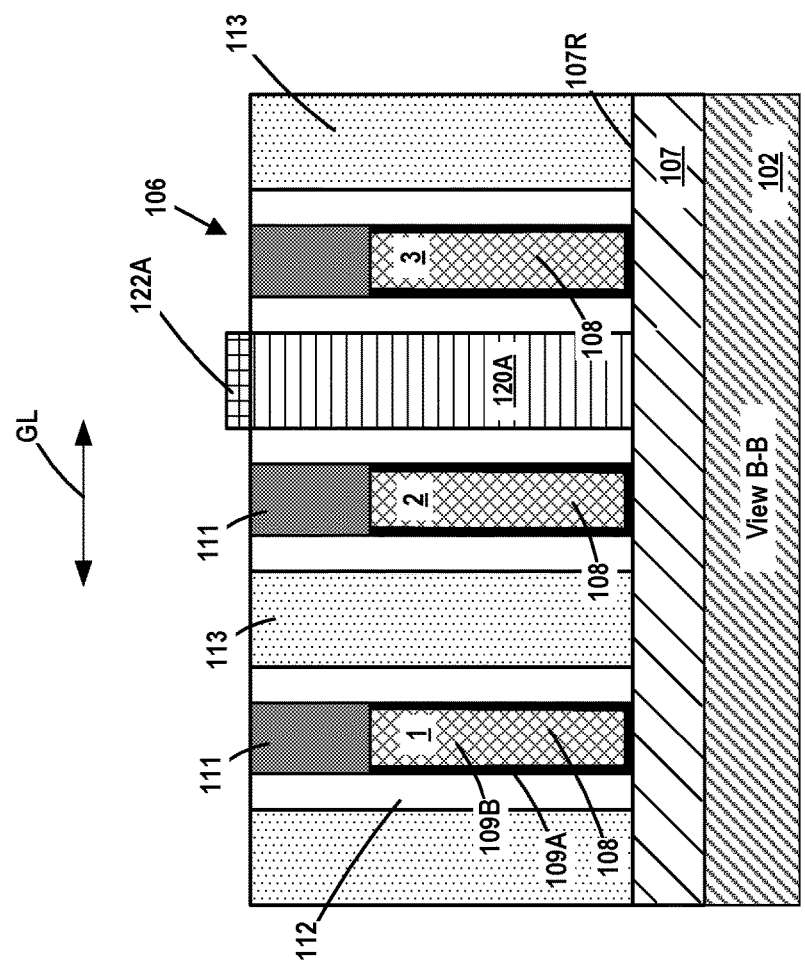
Figure 8:
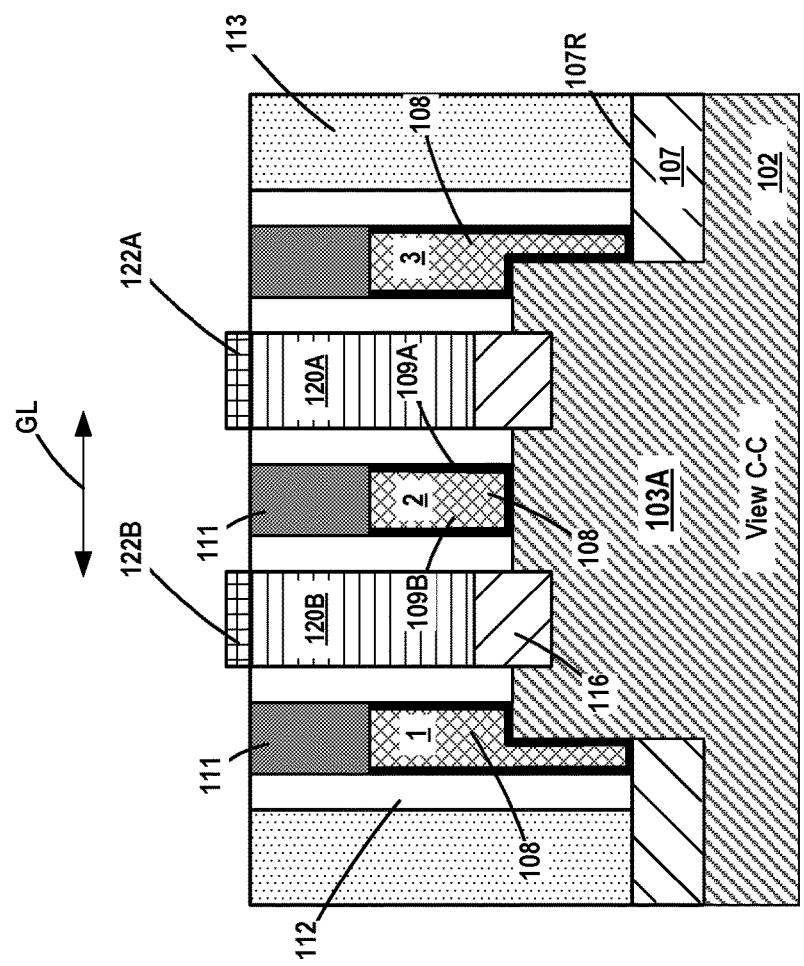
Figure 9:
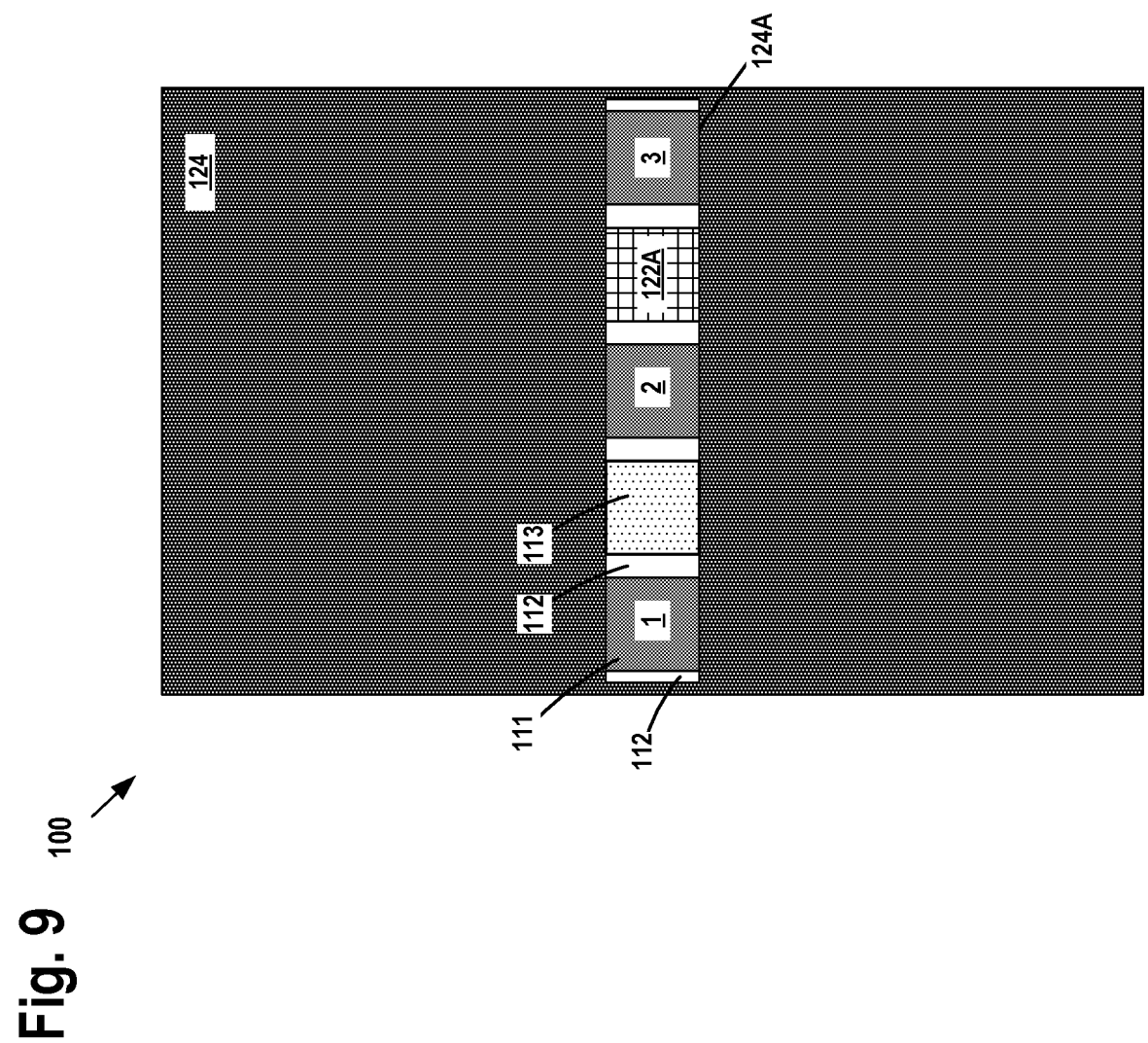
Figure 10:
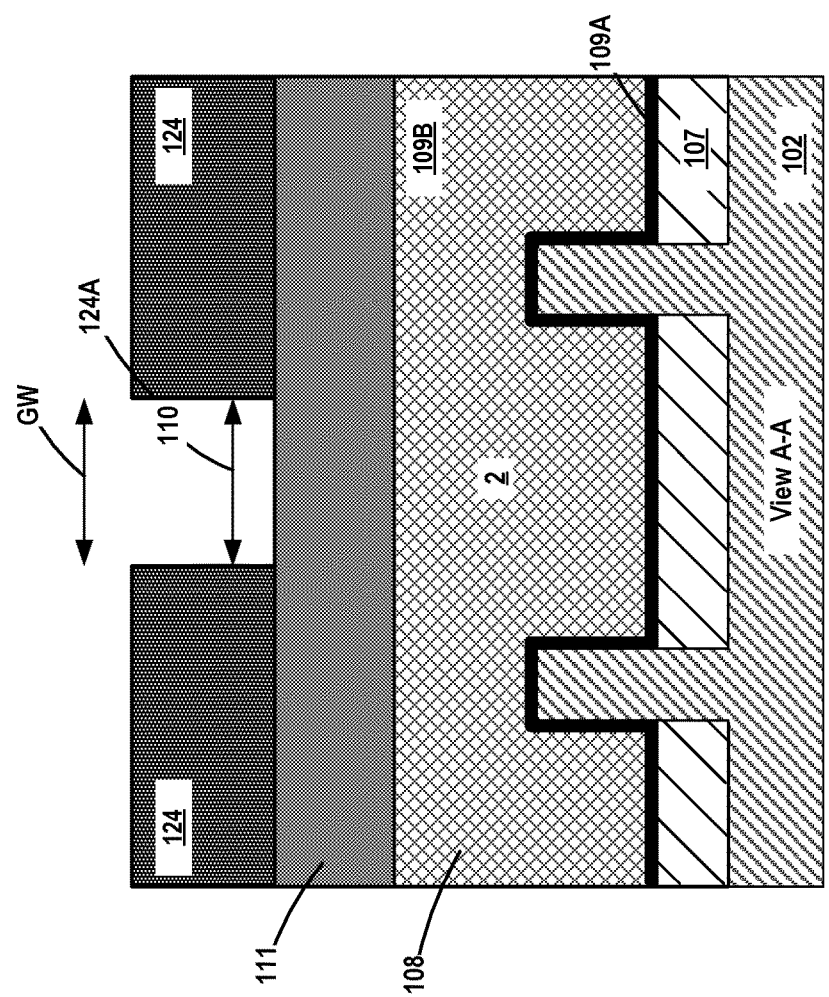
Figure 11:
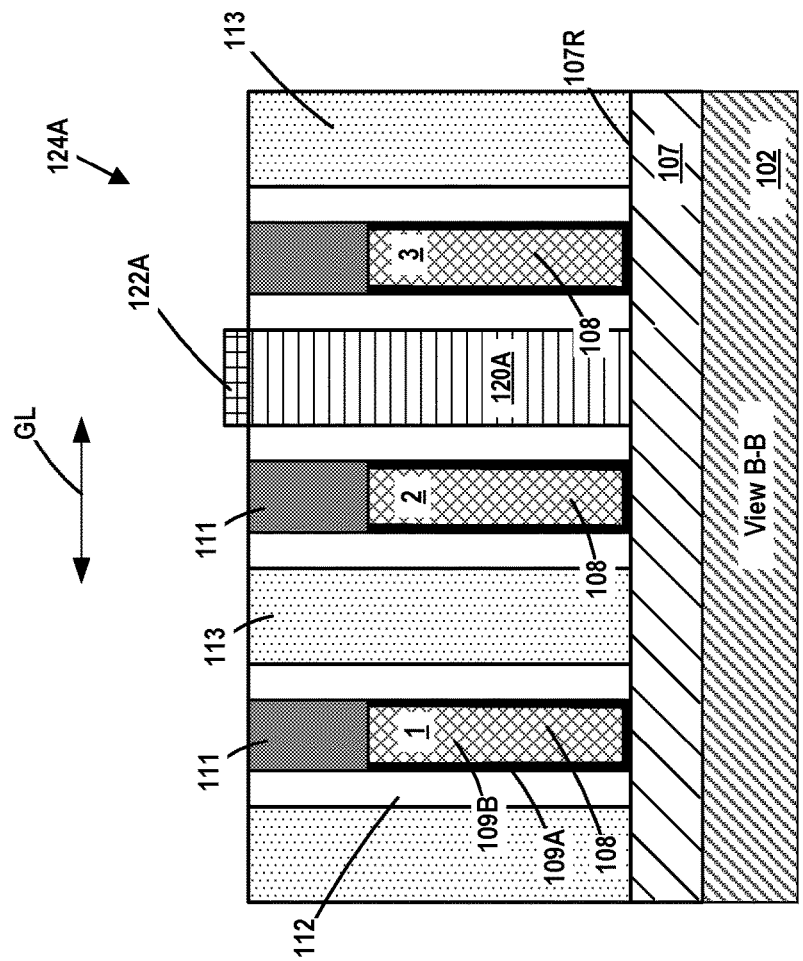
Figure 12:
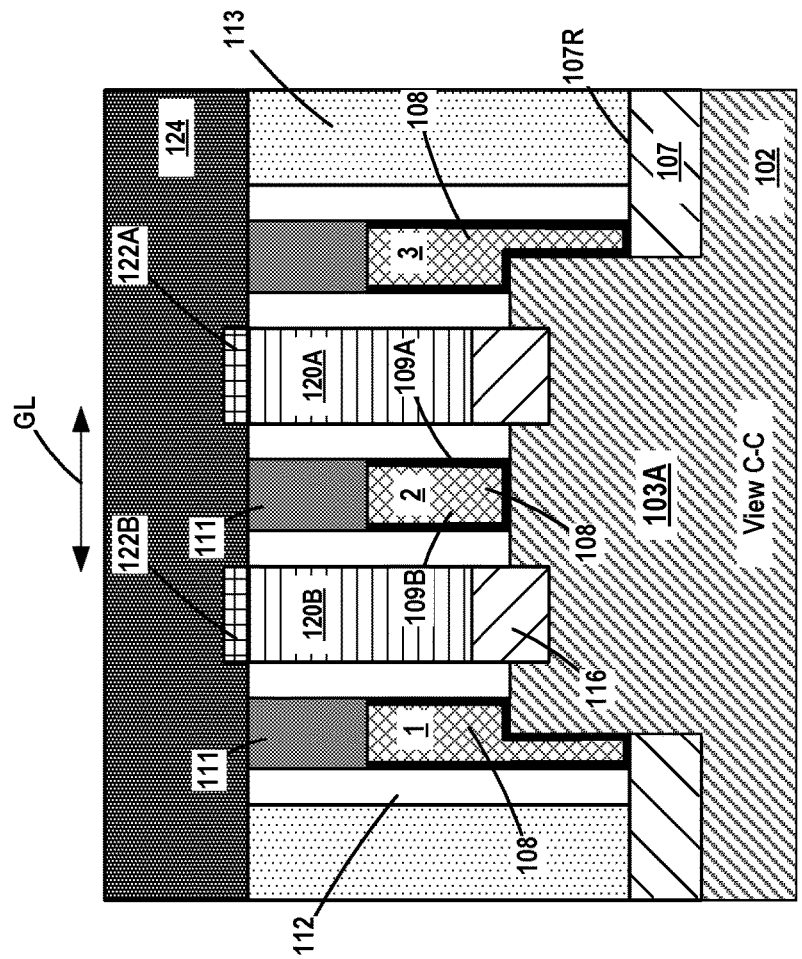
Figure 13:
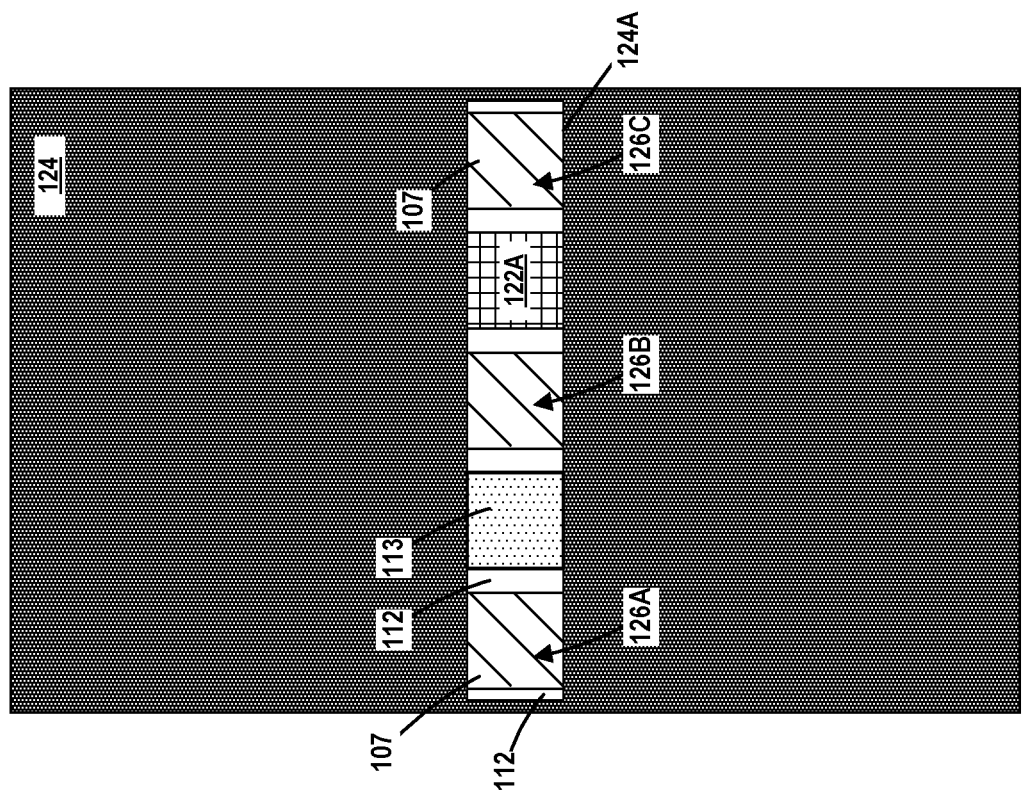
Figure 14:
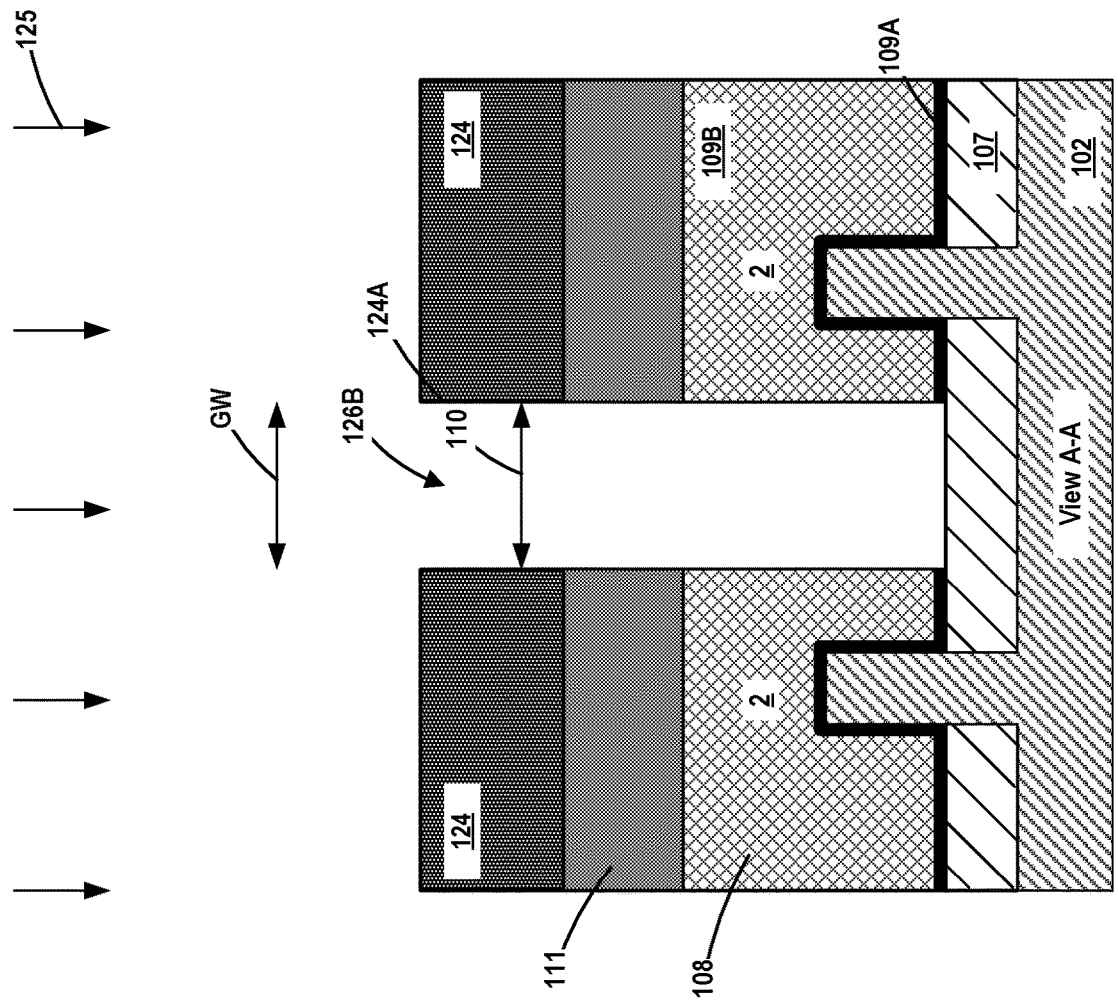
Figure 15:
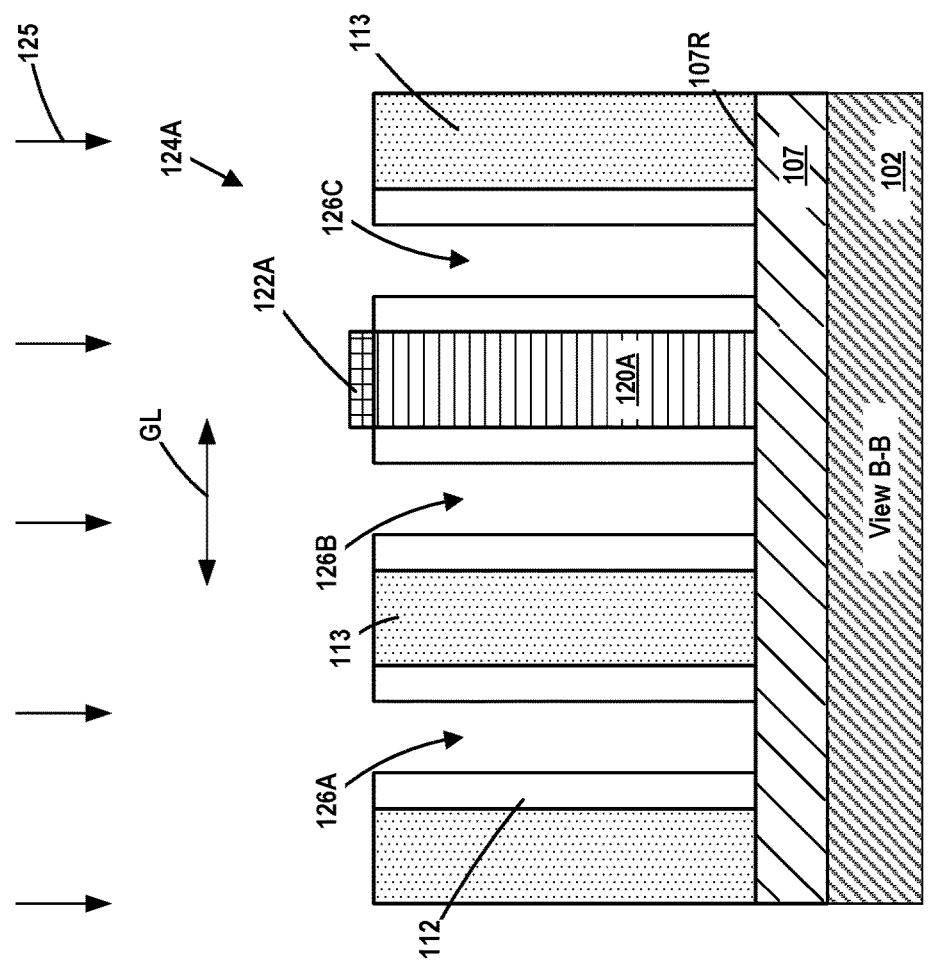
Figure 16:
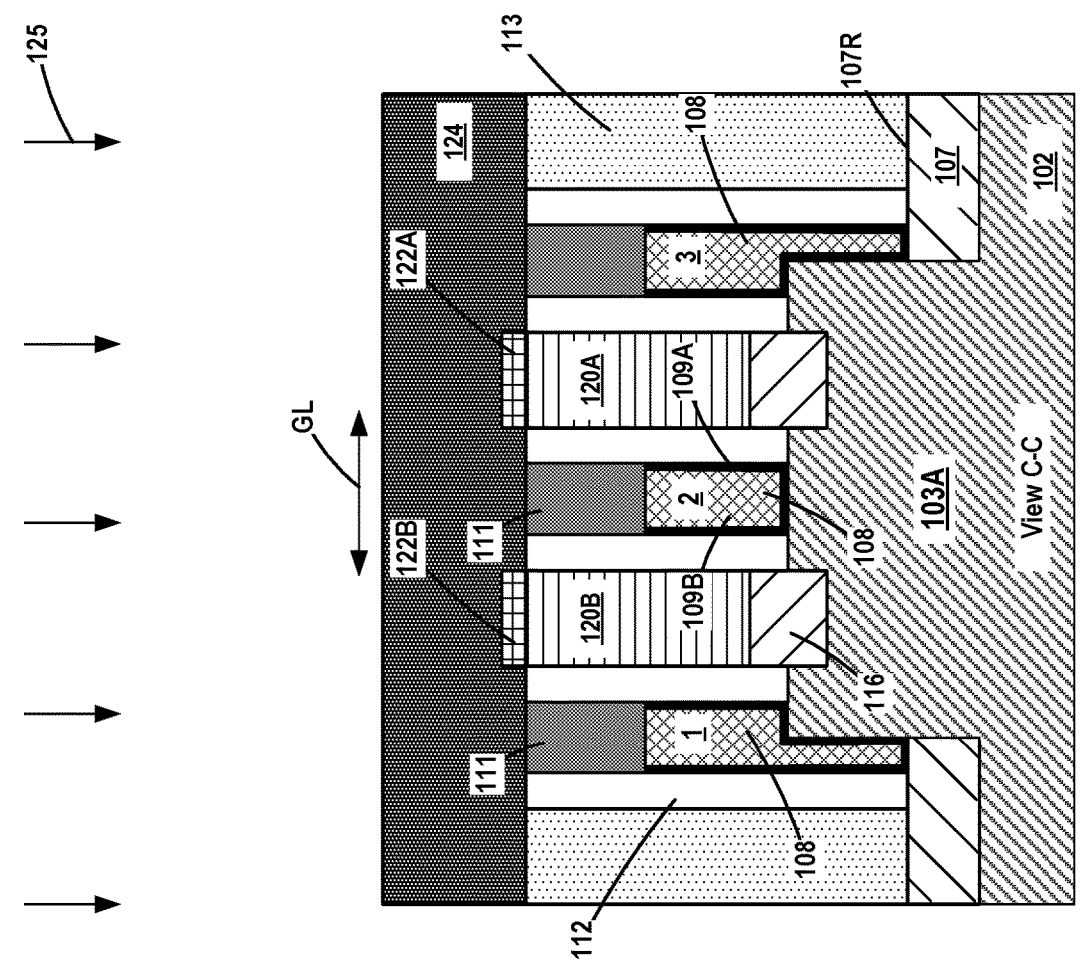
Figure 17:
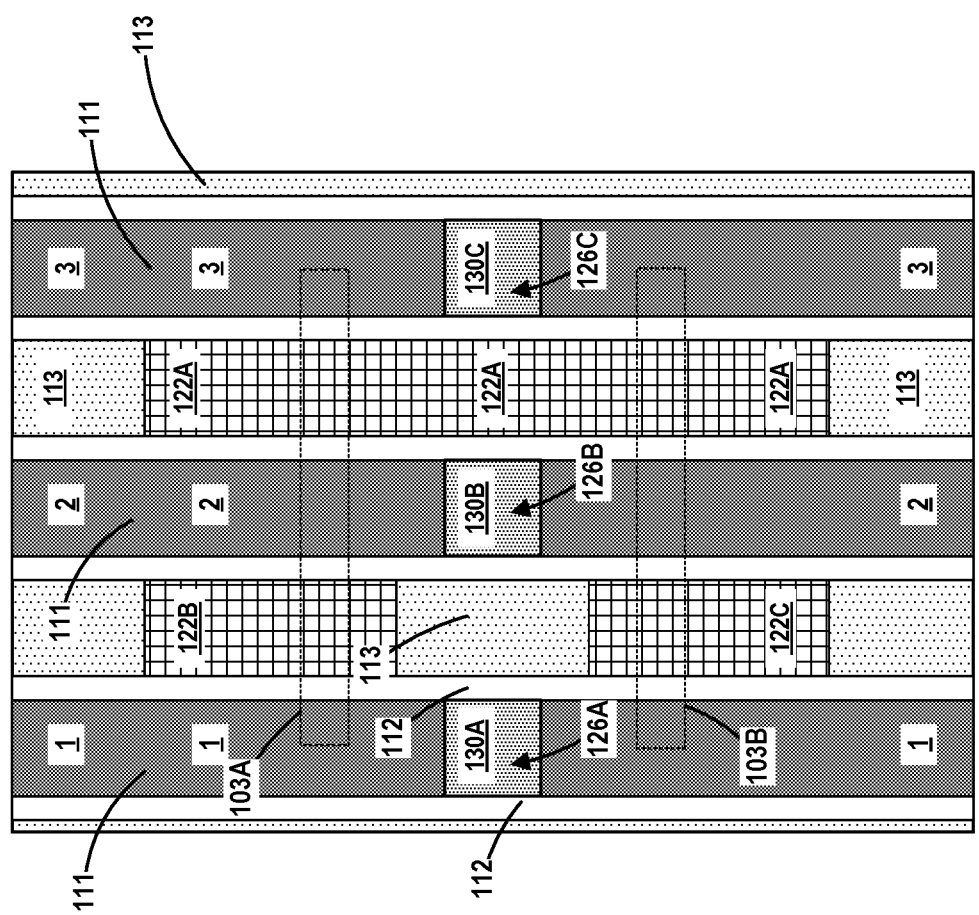

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of cutting gate structures after the formation of source/drain metallization structures and various novel integrated circuit (IC) product structures. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, etc. In the illustrative examples depicted herein, the transistor devices will be FinFET devices. Thus, the presently claimed inventions should not be considered to be limited to any particular form of transistors. Of course, the claimed inventions should not be considered to be limited to the illustrative examples depicted and described herein. With reference to the attached figures, various illustrative embodiments of the methods and devices disclosed herein will now be described in more detail. The various layers of material described below may be formed by performing any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 1-21 depict various methods of cutting gate structures after the formation of source/drain metallization structures and various novel integrated circuit (IC) product structures on an IC product 100. FIG. 1 is a simplistic plan view of one illustrative embodiment of an IC product 100 that may be formed using the methods described herein. Various cross-sectional views of the product 100 (views "A-A", "B-B" and "C-C") are taken where indicated in FIG. 1. The cross-sectional view A-A is taken in the gate width (GW) direction of the transistor devices, while the cross-sectional views B-B and CC are taken in the gate length (GL) direction of the transistor devices. The view C-C should be understood to be a cross-sectional view taken through the long axis of the fin 103A in a direction that corresponds to the gate length (current transport) direction of the FinFET device.

FIGS. 1-4 depict the product 100 at an advanced point in fabrication. More specifically, at this point in the illustrative process flow depicted herein, the product 100 generally comprises a plurality of gates 106 (see FIG. 1; numbered 1-3 for ease of reference) for various transistor devices that are formed in and above a semiconductor substrate 102. At this point in the process flow, each of the gates 106 comprises an elongated final gate structure 108 that span multiple transistor devices. As described more fully below, these initial final gate structures 108 will be cut so as to form separate final gate structures for different transistor devices. In the illustrative example depicted herein, the transistor devices are FinFET devices. However, as will be appreciated by one skilled in the art after a complete reading of the present application, the inventions disclosed herein should not be considered to be limited to IC products that include only FinFET transistor devices, as the methods disclosed herein may be used on a variety of different types of transistor devices on a variety of different integrated circuit products. The cross-sectional view A-A in the drawings is taken through gate number 2 in the gate width (GW) direction of the transistor devices.

At the point of processing shown in FIGS. 1-4, a plurality of fins 103A-B (collectively referenced using the numeral 103) have been formed in the substrate 102 using traditional manufacturing techniques, and the gates 106 have been formed across the fins 103. Also depicted are illustrative conductive source/drain structures 120A-C (collectively referenced using the numeral 120) (e.g., trench silicide structures) that are conductively coupled to the source/drain regions of the transistor devices.

Figure 18:
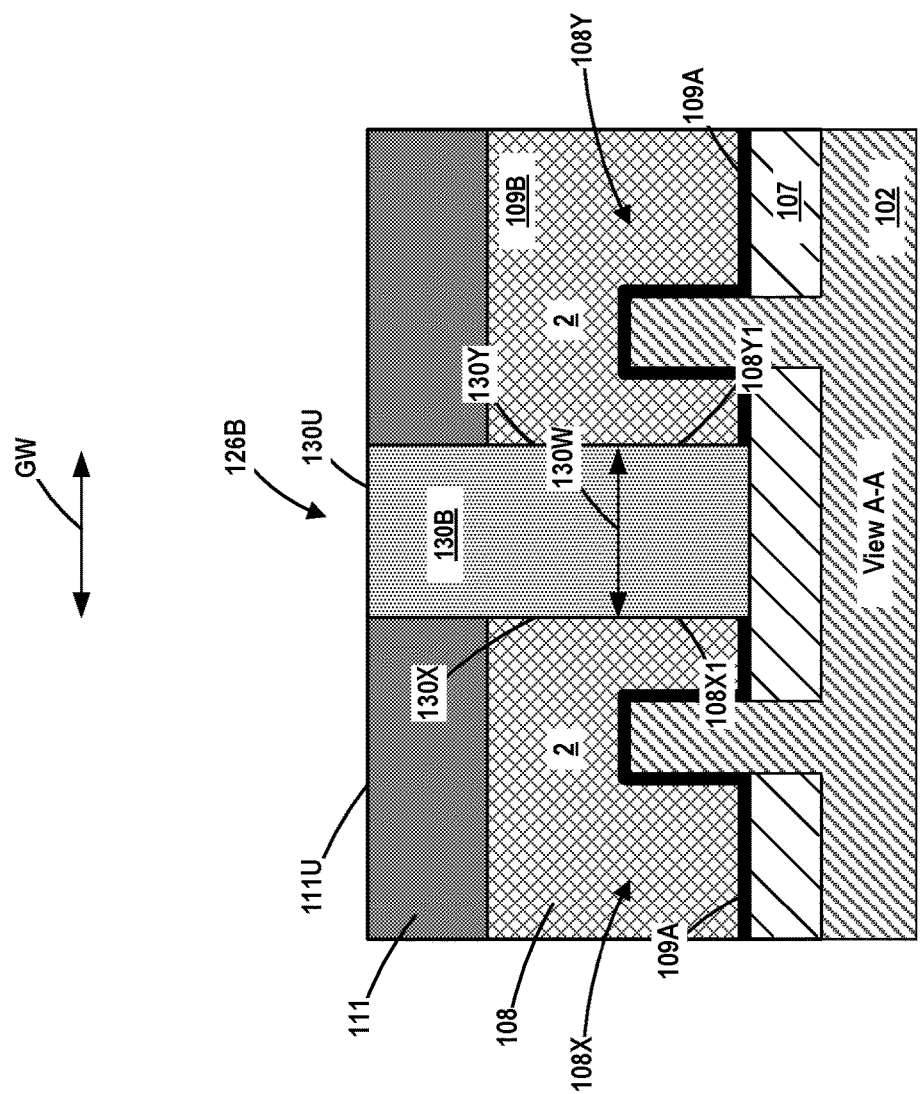
Figure 19:
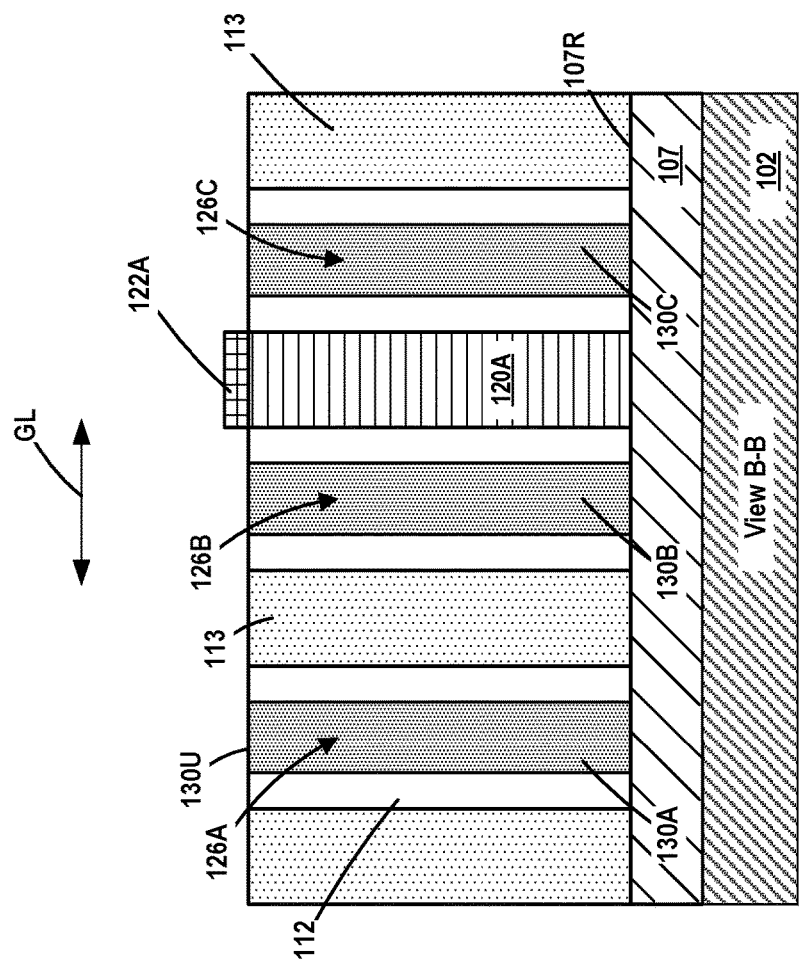
Figure 20:
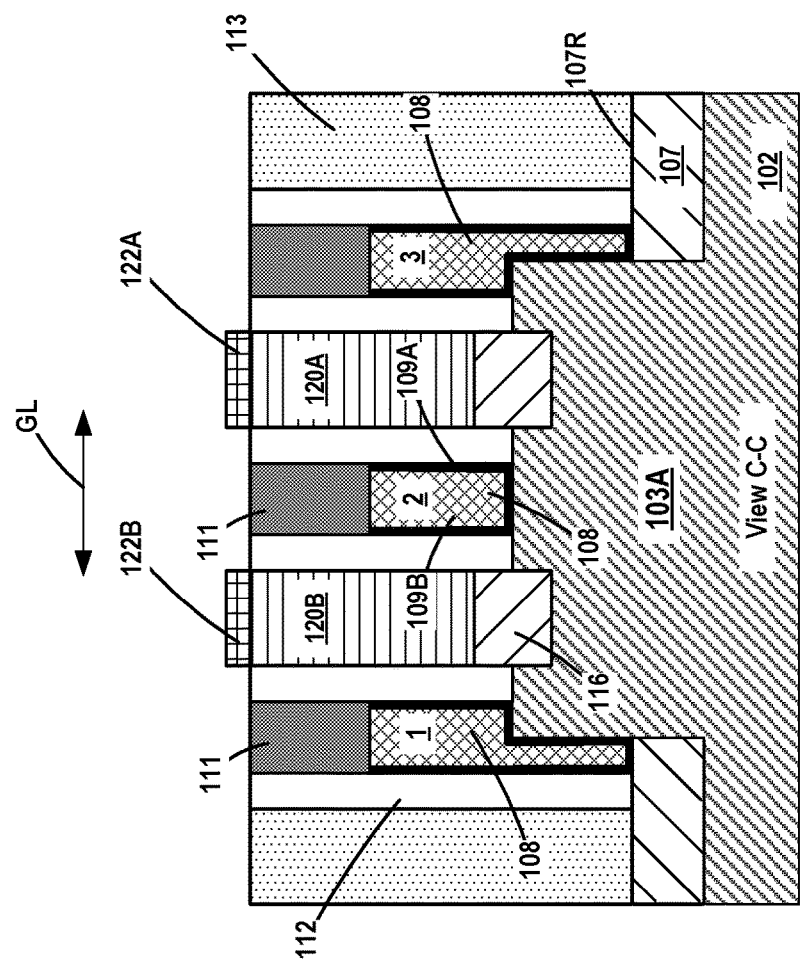

FIG. 1 also depicts a gate cut region 110 where a portion of the axial length of the final gate structures 108 will be cut and removed and replaced with a gate separation structure comprised of an insulating material, e.g., insulating gate separation structure 130B for gate number 2 (see FIG. 18). The gate cut region 110 is located vertically above isolation material (not shown in FIG. 1) that surrounds the transistor devices.

The substrate 102 (see FIG. 2) may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

FIGS. 1-4 depict the IC product 100 after several process operations were performed. First, as noted above, the fins 103 were formed by performing one or more etching processes, e.g., anisotropic etching processes, through a patterned fin-formation etch mask (not shown) to form a plurality of fin-formation trenches in the substrate 102 and thereby define the plurality of fins 103. The width and height of the fins 103 may vary depending upon the particular application. Additionally, the overall size, shape and configuration of the fin-formation trenches and fins 103 may vary depending on the particular application. Next, a recessed layer of insulating material 107 (e.g., silicon dioxide) with a recessed upper surface 107R was formed between the fins 103 by performing traditional manufacturing techniques.

Still with reference to FIGS. 1-4, after the layer of insulating material 107 was recessed, the gates 106 were formed above the fins 103. Each of the gates 106 includes a schematically depicted elongated final gate structure 108, a gate cap 111 and a simplistically-depicted sidewall spacer 112. The lateral thickness (at its base) of the simplistically-depicted sidewall spacer 112 may vary depending upon the particular application. In the illustrative example depicted herein, the final gate structures 108 are manufactured using known replacement gate manufacturing techniques. Using that manufacturing technique, the materials for the final gate structures 108 are sequentially formed in gate cavities (not shown) between the spacers 112 after removal of a sacrificial gate electrode (not shown) and a sacrificial gate insulation layer (not shown). The final gate structures 108 are typically comprised of a high-k gate insulation layer 109A, such as hafnium oxide, a material having a dielectric constant greater than 10, etc., and one or more conductive material layers that function as the conductive gate electrode 109B of the gate structure 108. For example, one or more work-function adjusting metal layers (not separately shown), e.g., titanium, tantalum, titanium nitride, tantalum nitride, titanium carbide, etc.) and a bulk conductive material (not separately shown), such as tungsten, may be deposited to form the conductive gate electrode 109B.

Still referencing FIGS. 1-4, prior to the formation of the final gate structures 108, epi semiconductor material 116 (see FIG. 4) may be formed on the exposed portions of the active regions (or fins 103 in the case of a FinFET device), i.e., in the source/drain regions of the devices, by performing an epitaxial growth process. The epi material 116 may be formed to any desired thickness. However, it should be understood that the epi material 116 need not be formed in all applications. Other layers of material, such as contact etch stop layers and the like, are not depicted in the drawings.

After formation of the epi semiconductor material 116, a layer of insulating material 113 (e.g., silicon dioxide) was blanket-deposited across the substrate. Thereafter, a chemical mechanical polishing (CMP) process was performed to planarize the layer of insulating material 113 using the original gate caps (not shown) positioned above the sacrificial gate structures as a polish-stop layer. At that point, traditional replacement gate manufacturing processes were performed to remove the original gate caps and the sacrificial gate structures so as to thereby form the gate cavities in which the materials for the final gate structures 108 will be sequentially deposited. Thereafter, in this particular embodiment, the materials of the final gate structures were recessed and the final gate caps 111 were formed on the product 100 above the recessed gate materials and within the gate cavities by depositing gate cap material and performing a CMP process operation to planarize the upper surface of the final gate caps 111 with the upper surface of the layer of insulating material 113.

Still referencing FIGS. 1-4, a patterned etch mask not shown, e.g., a patterned OPL layer, was formed on the product 100. The patterned etch mask comprises openings at locations where it is desired to remove the insulating material 113 selectively relative to the surrounding materials and thereafter form source/drain metallization structures—conductive source/drain structures 120—at locations where the insulating material 113 was removed. Then, an etching process was performed through the patterned etch mask to remove the exposed portions of the layer of insulating material 113, including portions of the insulating material positioned above the epi semiconductor material 116 in the source/drain regions of the transistor devices, and thereby expose the source/drain regions, i.e., expose the epi semiconductor material 116 positioned between the spacers 112. In one illustrative embodiment, the layer of insulating material 113 may be comprised of silicon dioxide, the sidewall spacers 112 and or the gate caps 111 may be comprised of a variety of different materials, e.g., silicon nitride, silicon carbon oxynitride (SiCON) or silicon carbon oxide (SiCO), and the spacers 112 and the gate caps 111 need not be made of the same material in all applications, but that situation may arise in some embodiments.

Still referencing FIGS. 1-4, after performing the etching process to remove the exposed portions of the insulating material 113, the patterned etch mask was removed. Then, material for the illustrative conductive source/drain structures 120A-C (e.g., trench silicide structures) was formed above the product 100 so as to over-fill the spaces above the exposed epi semiconductor material 116 in the source/drain regions of the devices and in other areas where the insulating material 113 was removed. At that point, one or more CMP and/or etch-back processes were performed to planarize the upper surface of the product with a level that approximately corresponds to the level of the upper surface of the gate caps 111. At the conclusion of such process operations, the upper surfaces of the conductive source/drain structures 120 are substantially planar with the upper surfaces of the gate caps 111. As shown in FIG. 1, the conductive source/drain structures 120 may extend at least for substantially the entire dimension of the active region in the gate width (GW) direction of the transistor devices (into and out of the plane of the drawing page in FIG. 4). In some cases, the conductive source/drain structures 120 may extend across the source/drain regions of multiple separate transistor devices as well as across regions of isolation material 107 between the separate transistors, as is the case with the illustrative conductive source/drain structure 120A (see FIGS. 1 and 3). The conductive source/drain structures 120 may comprise a variety of different conductive materials, e.g., tungsten, a metal, a metal compound, cobalt silicide, nickel silicide, titanium silicide, nickel platinum silicide, etc.

FIGS. 5-8 depict the product 100 after conductive source/drain metallization cap structures 122A-C (collectively referenced using the numeral 122) were selectively formed on and in contact with the exposed upper surfaces of the conductive source/drain structures 120A-C, respectively. The conductive source/drain metallization cap structures 122 may be comprised of a variety of conductive materials, e.g., ruthenium, iridium, ruthenium oxide, iridium oxide, platinum, a metal-containing material, a metal compound, etc. The vertical thickness of the conductive source/drain metallization cap structures 122 may vary depending upon the particular application. In one illustrative embodiment, the conductive source/drain metallization cap structures 122 may have a thickness that falls within the range of about 5-9 nm. The conductive source/drain metallization cap structures 122 may be formed by performing a selective area deposition type process so as to form the conductive source/drain metallization cap structures 122 substantially only on and in contact with the conductive source/drain structures 120. The process performed to form the conductive source/drain metallization cap structures 122 may be controlled so as to limit the formation of the material of the conductive source/drain metallization cap structures 122 on the surrounding materials, such as the spacers 112, the gate caps 111 and the insulating material 113. In one illustrative embodiment, wherein the conductive source/drain metallization cap structures 122 are comprised of ruthenium, it is believed that the conductive source/drain metallization cap structures 122 may be formed to a thickness of about 9 nm without the formation of any significant amount of ruthenium on the surrounding gate caps 111, sidewall spacers 112 and insulating material 113. However, to the extent that any of the material of the conductive source/drain metallization cap structures 122 does form on such surrounding materials, it will form to a significantly lesser thickness than the conductive source/drain metallization cap structures 122 that are formed on the conductive source/drain structures 120. Accordingly, if desired, the undesired portions of the material of the conductive source/drain metallization cap structures 122 may be effectively removed from above the surrounding structures (e.g., spacers 112, gate caps 111 and insulating material 113) by performing an isotropic etching process to remove the undesirable thinner portions of the material of the conductive source/drain metallization cap structures 122 while leaving the thicker conductive source/drain metallization cap structures 122 in position on the conductive source/drain structures 120.

FIGS. 9-12 depict the product 100 after a patterned etch mask 124, e.g., a patterned layer of photoresist, with an opening 124A formed therein was formed above the product 100. The patterned etch mask 124 is typically referred to as a "gate-cut" mask, as the opening 124A is positioned at a location where it is desired to cut or remove the materials of the final gate structures 108 for gates 1-3. In practice, there will be thousands of the openings 124A formed in the gate-cut mask 124. As depicted, the opening 124A exposes the gate caps 11, the sidewall spacers 112 and the insulating material 113 positioned between gates 1 and 2. The opening 124A also exposes a portion of the axial length of the conductive source/drain metallization cap structure 122A that is positioned on and in contact with the conductive source/drain structures 120A. The conductive source/drain metallization cap structures 122 were formed to so as to protect any of the underlying conductive source/drain structures 120 that would otherwise be exposed by the openings 124A in the gate cut mask 124.

FIGS. 13-16 depict the product 100 after an etching process sequence 125 comprised of one or more anisotropic etching processes was performed to remove exposed portions of the gate caps 111 and thereafter exposed portions of the gate structures 108 (including the conductive gate electrode 109B and the high-k insulating layer 109A) selectively relative to the surrounding materials, e.g., the spacers 112, the insulating material 113, the isolation material 107 and the exposed portion of the conductive source/drain metallization cap structure 122A. This process operation results in the formation of gate cut openings 126A-C (collectively referenced using the numeral 126) in the gate structures 108 for each of the gates 1-3, respectively. Note that the conductive source/drain metallization cap structure 122A protected the underlying conductive source/drain structure 120A during the etching process sequence 125. In one illustrative process flow, the etching process sequence may include a first fluorine-based plasma etching process to remove the gate caps 111 (comprised of silicon nitride for example) so as to expose the gate structures 108. To the extent that there is any erosion of the spacers 112 and/or the insulating material 113 during this gate cap removal process, such erosion will not be an issue as the final gate cut openings 126 will be filled with insulating material. Next, in the case where the conductive gate electrode 109B of the gate structures 108 comprises tungsten, a second fluorine-based plasma anisotropic etching process may be performed to remove the tungsten material. At that point, a chlorine-based plasma anisotropic etching process may be performed to remove exposed portions of any work function adjusting metal layer (that is technically part of the gate electrode 109B) and the high-k gate insulation layer 109A in the remaining portions of the exposed gate structures 108. Of course, the various etching processes 125 may be performed at any desired temperature using any desired etchants. The gate cut mask 124 is ultimately removed from the product.

FIGS. 17-20 depict the product 100 after several process operations were performed. First, a deposition process was performed so as to overfill the gate cut openings 126 with an insulating material, e.g., silicon nitride, silicon dioxide, a mixture of two or more materials of silicon oxide, silicon nitride and silicon carbide, a low-k insulating material (k value of 3.3. or less). Thereafter, one or more CMP process operations and/or etch-back process operations were performed that stop on the upper surface of the gate caps 111. This process operation removes excess amounts of the insulating material outside of the gate-cut openings 126. As a result, the remaining insulating material in the gate-cut openings 126A-C constitutes insulating gate separation structures 130A-C (collectively referenced using the numeral 130) with an upper surface 130U that is substantially planar with the upper surface 111U of the gate caps 111. Note that during the CMP and/or etch-back process, the conductive source/drain metallization cap structures 122 may not be removed due to the relatively harder nature of the conductive materials used for the conductive source/drain metallization cap structures 122 as compared to the insulating materials used to form the insulating gate separation structures 130 and/or due to the etch selectivity between the materials of the conductive source/drain metallization cap structures 122 and the insulating material deposited in the gate-cut openings 126. Accordingly, the conductive source/drain metallization cap structures 122 may be left in position in the final IC product or they may be removed if desired.

Figure 21:
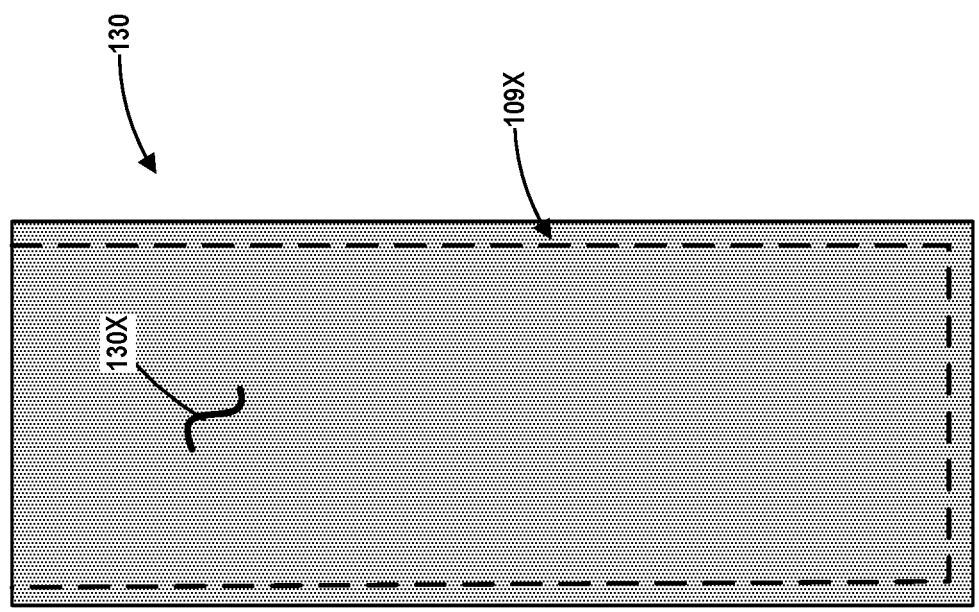

As will be appreciated by those skilled in the art after a complete reading of the present application, and with reference to FIG. 18 (for example), the cutting of the final gate structures 108 of the original gates 106 and the formation of the insulating gate separation structures 130 effectively cuts the final gate structures 108 into two (in the depicted example) axially separated final first and second gate structures 108X and 108Y with end surfaces 108X1 and 108Y1, respectively. In the depicted example, the insulating gate separation structure 130 has a substantially uniform nominal width 130W (in the gate width (GW) direction of the transistor devices) through substantially the entire vertical height of the insulating gate separation structure 130. As indicated, the insulating gate separation structure 130 has first and second opposing side surfaces 130X, 130Y, respectively, when viewed in a cross-section taken through the insulating gate separation structure 130 in the gate width direction of the devices (as shown in FIG. 18). FIG. 21 is a facing view of the side surface 130X of the insulating gate separation structures 130. The side surface 130X abuts and engages the end surface 108X1 of the first gate structure 108X, while the side surface 130Y abuts and engages the end surface 108Y1 of the second gate structure 108Y. As depicted in FIGS. 18 and 21, substantially the entire surface area of the side surface 130X is free from contact with the high-k gate insulation layer 109A that is part of the first gate structure 108X. The same applies with respect to the side surface 130Y. Rather, there is a relatively small, generally U-shaped contact area 109X between the high-k gate insulation layer 109A and the side surface 130X of the insulating gate separation structure 130 as depicted by the dashed line in FIG. 21. The same applies with respect to the side surface 130Y.

At the point of processing depicted in FIGS. 17-21, the fabrication of the product 100 may be completed by performing traditional manufacturing techniques to form various standard features on the IC product 100. For example, one or more layers of insulating material (not shown) may be formed on the product 100 followed by performing one or more CMP processes. At that point, traditional manufacturing operations may be performed to form various contact structures that conductively contact the source/drain contact structures 120 and the gate structures 108.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a gate above a semiconductor substrate for first and second transistor devices, said gate comprising a final gate structure and a gate cap positioned above said final gate structure;
   forming source/drain regions for said first and second transistor devices;
   forming a conductive source/drain structure that is conductively coupled to a source/drain region of said first transistor device and conductively coupled to a source/drain region of said second transistor device;
   performing a selective area deposition process to selectively form a conductive source/drain metallization cap structure on and in contact with an upper surface of said conductive source/drain structure;
   forming a patterned etch mask that exposes a portion of an axial length of said gate cap and a portion of an axial length of said conductive source/drain metallization cap structure; and
   with said patterned etch mask in position, performing at least one etching process to remove said exposed portion of said gate cap and thereafter an exposed portion of said final gate structure so as to form a gate cut opening, wherein said conductive source/drain metallization cap structure protects said underlying conductive source/drain structure during said at least one etching process.

2. The method of claim 1, wherein forming said gate cut opening separates said final gate structure into a first final gate structure for said first transistor device and a second final gate structure for said second transistor device.

3. The method of claim 1, further comprising forming a gate separation structure in said gate cut opening, said gate separation structure comprising an insulating material.

4. The method of claim 3, wherein forming said gate separation structure comprises forming said gate separation structure with a first side surface and a second side surface, said second side surface being opposite to said first side surface, and wherein an end surface of said first final gate structure contacts said first side surface of said gate separation structure and an end surface of said second final gate structure contacts said second side surface of said gate separation structure.

5. The method of claim 4, wherein said gate separation structure has a substantially uniform width in a direction corresponding to a gate width direction of said first and second transistor devices for substantially an entire vertical height of said gate separation structure.

6. The method of claim 1, further comprising, after forming said source/drain regions, forming epitaxial semiconductor material in said source/drain regions of each of said first and second transistor devices.

7. The method of claim 3, wherein said final gate structure comprises a high-k (k value of 10 or greater) gate insulation layer and a gate electrode that comprises at least one metal-containing layer of material, said gate separation structure comprises at least one of silicon nitride, silicon dioxide, a mixture of two or more materials of silicon oxide, silicon nitride and silicon carbide, or a low-k insulating material (k value of 3.3 or less), and said first and second transistor devices are FinFET devices.

8. The method of claim 3, wherein forming said gate separation structure comprises:
depositing an insulating material so as to overfill said gate cut opening; and
removing excess amounts of said deposited insulating material positioned outside of said gate cut opening so as to form said gate separation structure.

9. The method of claim 1, wherein performing said at least one etching process to remove said exposed portion of said gate cap and thereafter said exposed portion of said final gate structure so as to form said gate cut opening comprises:
performing a first anisotropic etching process to remove said exposed portion of said gate cap so as to expose a portion of said final gate structure;
performing a second anisotropic etching process to remove at least part of said exposed portion of said final gate structure; and
performing a third anisotropic etching process to remove any remaining part of said exposed portion of said final gate structure.

10. The method of claim 9, wherein said gate cap comprises silicon nitride, said final gate structure comprises a high-k (k value of 10 or greater) gate insulation layer and a gate electrode structure comprising a work-function adjusting metal layer and tungsten and wherein:
performing said first anisotropic etching process comprises performing a first fluorine-based plasma anisotropic etching process to remove said exposed portion of said gate cap;
performing said second anisotropic etching process comprises performing a second fluorine-based plasma anisotropic etching process to remove tungsten from said exposed portion of said final gate structure; and
performing said third anisotropic etching process comprises performing a chlorine-based anisotropic etching process to remove said work-function adjusting metal layer and said high-k gate insulation layer.

11. The method of claim 1, wherein said conductive source/drain structure comprises one of tungsten, a metal, a metal compound, a metal silicide, cobalt silicide or nickel silicide, titanium silicide, or nickel platinum silicide, and said conductive source/drain metallization cap structure comprises one of ruthenium, iridium, ruthenium oxide, iridium oxide, platinum, a metal-containing material or a metal compound.

12. The method of claim 9, wherein said first anisotropic etching process, said second anisotropic etching process and said third anisotropic etching process are all performed through said patterned etch mask.

13. A method, comprising:
forming a gate above a semiconductor substrate for first and second transistor devices, said gate comprising a final gate structure and a gate cap positioned above said final gate structure;
forming source/drain regions for said first and second transistor devices;
forming epitaxial semiconductor material in said source/drain regions of each of said first and second transistor devices;
forming a conductive source/drain structure that is conductively coupled to a source/drain region of said first transistor device and conductively coupled to a source/drain region of said second transistor device;
performing a selective area deposition process to selectively form a conductive source/drain metallization cap structure on and in contact with an upper surface of said conductive source/drain structure;
forming a patterned etch mask that exposes a portion of an axial length of said gate cap and a portion of an axial length of said conductive source/drain metallization cap structure;
with said patterned etch mask in position, performing at least one etching process to remove said exposed portion of said gate cap and thereafter said exposed portion of said final gate structure so as to form a gate cut opening that separates said final gate structure into a first final gate structure for said first transistor device and a second final gate structure for said second transistor device, wherein said conductive source/drain metallization cap structure protects said underlying conductive source/drain structure during said at least one etching process; and
forming a gate separation structure in said gate cut opening, said gate separation structure comprising an insulating material.

14. The method of claim 13, wherein forming said gate separation structure comprises forming said gate separation structure with a first side surface and a second side surface, said second side surface being opposite to said first side surface, and wherein an end surface of said first final gate structure contacts said first side surface of said gate separation structure, and an end surface of said second final gate structure contacts said second side surface of said gate separation structure.

15. The method of claim 13, wherein said gate separation structure has a substantially uniform width in a direction corresponding to a gate width direction of said first and second transistor devices for substantially an entire vertical height of said gate separation structure.

16. The method of claim 13, wherein forming said gate separation structure comprises:
depositing an insulating material so as to overfill said gate cut opening; and
removing excess amounts of said deposited insulating material positioned outside of said gate cut opening so as to form said gate separation structure.

17. The method of claim 13, wherein performing said at least one etching process to remove said exposed portion of said gate cap and thereafter said exposed portion of said final gate structure so as to form said gate cut opening comprises:
performing a first anisotropic etching process to remove said exposed portion of said gate cap so as to expose a portion of said final gate structure;
performing a second anisotropic etching process to remove at least part of said exposed portion of said final gate structure; and
performing a third anisotropic etching process to remove any remaining part of said exposed portion of said final gate structure.

* * * * *